US009651602B2

(12) United States Patent
Oestreicher (10) Patent No.: US 9,651,602 B2
(45) Date of Patent: May 16, 2017

(54) DEVICE AND METHOD FOR MONITORING AND SWITCHING A LOAD CIRCUIT

(71) Applicant: Pepperl + Fuchs GmbH, Mannheim (DE)

(72) Inventor: Michael Oestreicher, Mannheim (DE)

(73) Assignee: Pepperl + Fuchs GmbH, Mannheim (DE)

( * ) Notice: Subject to any disclaimer, the term of this patent is extended or adjusted under 35 U.S.C. 154(b) by 15 days.

(21) Appl. No.: 14/805,747

(22) Filed: Jul. 22, 2015

(65) Prior Publication Data

US 2016/0025792 A1 Jan. 28, 2016

(30) Foreign Application Priority Data

Jul. 28, 2014 (EP) .................................. 14178797

(51) Int. Cl.
| | |
|---|---|
| *G01R 31/04* | (2006.01) |
| *G01R 31/02* | (2006.01) |
| *G05B 15/00* | (2006.01) |
| *G05B 23/00* | (2006.01) |
| *G05B 9/02* | (2006.01) |

(52) U.S. Cl.
CPC ............ *G01R 31/025* (2013.01); *G05B 9/02* (2013.01); *G05B 15/00* (2013.01); *G05B 23/00* (2013.01)

(58) Field of Classification Search
CPC  H01L 2224/48091; H01L 2924/00014; G01R 27/16; G01R 31/3658; G01R 29/0821; H01H 47/22; G06F 15/7867
USPC ....... 324/425–440, 444, 255, 500, 522, 713, 324/72.5, 76.11, 134, 111, 538–543, 600, 324/756.01
See application file for complete search history.

(56) References Cited

U.S. PATENT DOCUMENTS

| | | | | |
|---|---|---|---|---|
| 7,046,031 B2* | 5/2006 | Magerl | ................... | G05B 9/03 307/113 |
| 2005/0035665 A1 | 2/2005 | Magerl et al. | | |
| 2013/0057293 A1* | 3/2013 | Miyamoto | ........... | G01R 31/362 324/433 |

FOREIGN PATENT DOCUMENTS

| | | |
|---|---|---|
| DE | 4441581 A1 | 4/1996 |
| DE | 10327959 A1 | 1/2005 |

OTHER PUBLICATIONS

Kelperis, K., "European Search Report," Feb. 6, 2015, 2 pages.

* cited by examiner

*Primary Examiner* — Melissa Koval
*Assistant Examiner* — Trung Nguyen
(74) *Attorney, Agent, or Firm* — LaBatt, LLC (57) ABSTRACT

The invention relates to a device for monitoring and switching a load circuit, having an input part and an output part, having switching inputs to connect a controller to the input part, having switching outputs to connect at least one load circuit with at least one load to be switched to the output part, having at least one load switch to switch, in particular to switch on and off, the at least one load, having at least one fault detection circuit to detect a fault in the load circuit and to generate at least a first fault signal in the output part, and having a galvanic isolation stage for galvanically isolated transmission of this first fault signal and/or a second fault signal derived from this first fault signal from the output part to the input part. According to the invention the input part has an input circuit which converts switching commands of the controller incoming via the switching inputs into switching processes of the load switches. The transmitted fault signal is made available via the switching inputs for evaluation.

15 Claims, 7 Drawing Sheets

DEVICE AND METHOD FOR MONITORING AND SWITCHING A LOAD CIRCUIT

REFERENCE TO RELATED APPLICATIONS

The current application claims priority to European Patent Application No. 14 178 797.8, which was filed on 28 Jul. 2014, and which is hereby incorporated by reference.

TECHNICAL FIELD

The present invention relates to a device and a method for monitoring and switching a load circuit, thus a current circuit comprising a load circuit supply and a load, wherein this current circuit can be switched, in particular closed or interrupted, by a load switch.

BACKGROUND ART

In the field of process automation sensors and/or actuators (or effectors, etc.), thus converters (or drive elements, controlling elements), which convert commands of a controller (e.g. of a control computer), mostly present in the form of electrical signals, into forces, movements or other physical effects (such as e.g. a pressure or temperature change), are frequently controlled via point-to-point connections by controllers. An interface component (interface) is frequently arranged between the actual controller and the sensor or actor, which adapts the electrical properties of the signals emitted by the controller to the properties required for the signals to be received by the sensors or actuators due to the mode of construction and functioning of these sensors or actuators. The controller is located in these cases on the control side of the interface component, whereas the side of the interface component facing away from the controller is called the field side.

The term "line fault transparency" is understood to be a function of such systems which ensures that a fault, for example a line break or a short circuit, in the wiring on the field side of an interface component is transmitted to the control side thereof, so that the controller can detect the fault, and wherein the fault ideally manifests itself on the control side in the same way for the controller as if this fault arising on the field side were present on the control side of the interface component.

A series of conventional controllers indeed offers the possibility of detecting faults such as line breaks or short circuits in the wiring of field devices connected directly to the controller.

If an interface component is switched between the controller and a field device the controller can only detect faults in the cable connection on the control side of the interface component but not faults on the field side of the interface component. This is particularly problematic in cases in which the interface component is arranged in proximity to the controller because the relatively long cable section between the interface component and the field device remains unmonitored.

SUMMARY OF THE INVENTION

An object of the present invention can thus be seen in indicating a device and a method, with which the above-mentioned disadvantages are avoided.

This object is achieved by a device for monitoring and switching a load circuit, having an input part and an output part, switching inputs to connect a controller to the input part, switching outputs to connect at least one load circuit with at least one load to be switched to the output part, at least one load switch for switching, in particular for switching on and off, the at least one load, wherein the input part has an input circuit which converts switching commands of the controller incoming via the switching inputs into switching processes of the load switches, having at least one fault detection circuit to detect a fault in the load circuit and to generate at least a first fault signal in the output part and a galvanic isolation stage for galvanically isolated transmission of this first fault signal and/or a second fault signal derived from this first fault signal from the output part to the input part, wherein the transmitted fault signal is made available via the switching inputs for evaluation. This object is also achieved by a method for monitoring and switching a load circuit with a load, wherein a device with an input part and an output part is or has been switched between a controller and the load circuit, the input part has an input circuit which converts switching commands of the controller incoming via switching inputs into switching processes of the load switches, at least one fault detection circuit detects faults in the load circuit and generates at least a first fault signal in the output part, a galvanic isolation stage transmits this first fault signal and/or a second fault signal derived from this first fault signal from the output part to the input part in a galvanically isolated way, and wherein the transmitted fault signal is made available via the switching inputs for evaluation.

Preferred embodiments of the present invention form the subject matter of the dependent claims.

According to the invention a device for monitoring and switching a load circuit is provided, having an input part and an output part, having switching inputs to connect a controller to the input part, having switching outputs to connect at least one load circuit with at least one load to be switched to the output part, and having at least one load switch to switch, in particular to switch on or off, the at least one load. The input part has an input circuit which converts switching commands of the controller incoming via the switching inputs into switching processes of the load switches. The device according to the invention further has at least one fault detection circuit to detect a fault in the load circuit and to generate at least a first fault signal in the output part, and a galvanic isolation stage for galvanically isolated transmission of this first fault signal and/or a second fault signal derived from this first fault signal from the output part to the input part, wherein the transmitted fault signal is made available via the switching inputs for evaluation.

The device according to the invention for monitoring and switching a load circuit or one of the preferred embodiments thereof is preferably switched as an interface component between a controller and a unit to be controlled on the field side, thus in particular a sensor or an actor, or is a constituent part of such an interface component. In this sense reference is also made below to an interface component according to the invention.

In the present context a load circuit is to be understood to be a current circuit comprising a, not necessarily ohmic, load and a load circuit supply, thus an electrical energy source, which allows a current, in particular a direct current or an alternating current, to flow in the load circuit through the load. The load circuit is a current circuit in a unit to be controlled on the field side of the device, thus in particular in a sensor or in an actuator.

In the present context a load is to be understood to be any general, in particular n-ohmic, electrical consumer.

In the present context a load switch is to be understood to be a means for switching a load or a current in a load circuit, in particular for switching on and off a load or a current in a load circuit.

In the present context a device for monitoring a load circuit is to be understood to be an electronic or electrical circuit which ensures that a fault, in particular a line break or a short circuit, in the load circuit to be monitored on the field side of the device manifests itself preferably as the same type of fault, thus in particular as a line break or a short circuit, on the control side of the device for the controller.

In the present context an input part of a device according to the invention, in particular an interface component according to the invention, is to be understood to be a sub-device, in particular a sub-circuit, to which a controller is or can be connected via switching inputs. The input part receives switching commands of the controller via the switching inputs, receives a fault signal from an output part of the device according to the invention and makes the received fault signal available to the controller via the switching inputs for evaluation. This preferably takes place in the form of a switchable no-load current in the input part which is switched in dependence upon the received fault signal.

In the present context an output part of a device according to the invention, in particular an interface component according to the invention, is to be understood to be a sub-device, in particular a sub-circuit, to which at least one load circuit of at least one unit to be controlled, with at least one load, is connected, or can be connected, via switching outputs. The output part has at least one load switch to switch the at least one load which is preferably in active connection with an input circuit of the input part, wherein the input circuit converts switching commands of the controller incoming via the switching inputs into switching processes of the load switches.

In the present context a switching input is to be understood to be at least one electrically conductive terminal contact of the input part of a device according to the invention, in particular an interface component according to the invention, via which the input part and thus the device are or can be connected to a controller.

In the present context a switching output is to be understood to be at least one electrically conductive terminal contact of the output part of a device according to the invention, in particular an interface component according to the invention, via which the output part and thus the device are or can be connected to a load circuit.

In the present context an input circuit is to be understood to be a sub-circuit of the input part of a device according to the invention, in particular an interface component according to the invention, which converts switching commands of the controller incoming via the switching inputs into switching processes of the load switches. Such an input circuit preferably has a relay to switch at least one load switch.

In the present context a switching command of a controller is to be understood to be an electrical signal, a plurality of simultaneous electrical signals and/or a temporal sequence of electrical signals which are received by an input circuit via switching inputs of the controller and preferably converted with the aid of the output circuit into switching processes of the load switches.

In the present context an, in particular first, second, derived or transmitted, fault signal is to be understood to be an electrical, in particular electromagnetic, mechanical, optical or optoelectronic, signal or a combination of such signals or a temporal sequence of such signals, which is intended to indicate a fault in the load circuit. A first or second fault signal is to be understood to be such a fault signal in the output part of a device according to the invention, in particular an interface component according to the invention. A transmitted fault signal is to be understood to be such a fault signal in the input part of a device according to the invention, in particular an interface component according to the invention. A derived fault signal is to be understood to be a second fault signal which is or has been generated from a first fault signal by at least one processing step. The second fault signal can preferably be transmitted via a galvanic isolation stage, for example a pulsating or alternating signal, which is derived from a single first fault signal, for example from a direct current, preferably by means of a trigger circuit.

In the present context a fault detection circuit is to be understood to be an electrical or electronic circuit which is electrically connected, preferably in series or in parallel, with at least one load circuit and generates a fault signal if a fault arises or is present in this at least one load circuit.

In the present context an evaluation of a fault signal is to be understood to be a processing of this fault signal, preferably by a, or the, controller, of which the result in the controller influences the operating mode of the controller having regard to the switching of at least one load in at least one load circuit switched by the controller.

In the present context a galvanic isolation stage is to be understood to be a means which facilitates an information transmission between two electrical circuits without an electrically conductive connection between these two electrical circuits. Important examples for such galvanic isolations or isolation stages are inductive isolation stages in the form of transformers with coils electrically isolated from each other, preferably on a common iron core, capacitive isolation stages, electromechanical components such as e.g. relays or optoelectronic converters, in particular so-called optocouplers. The galvanically isolated transmission of a fault signal, in particular from the output part to the input part, is to be understood correspondingly to be a transmission of a fault signal, in particular from the output part to the input part, without an electrically conductive connection, in particular from the output part to the input part.

In the present context a trigger circuit is to be understood to be an electronic or electrical circuit which can be in two alternate states, between which it automatically switches, possibly activated by a control signal. Such circuits are also known as astable multivibrators.

In the present context a no-load current or a no-load current path are to be understood to be a switchable electrical current flowing on the control side of the device according to the invention or a circuit arrangement for generating a switchable no-load current. The flowing of the no-load current indicates to the controller preferably that no line break is present in the load circuit.

In the present context a fault in the load circuit is to be understood in particular to be a line break or a short circuit in the load circuit.

In particularly preferred variants of the device according to the invention and the method according to the invention no auxiliary power source is present to supply the device according to the invention. These variants are characterised accordingly by a lower use of equipment. The device according to the invention is then supplied with electrical energy from the load circuit supply and/or from the control side.

If the line is disconnected at a point in a current circuit, for example due to a defective cable or a loose plug-in connection, a line break is present. This prevents a current flow in all operating states and is thus in principle very easy to detect. In the case of a switched-on load, the testing of the current flow is thus sufficient to detect a line break. If the load is switched off the invention preferably provides to take from the load circuit a, preferably low, test current which is preferably constant and particularly preferably is selected so low that this current cannot switch on the load. If this test current flow is or has been interrupted a line break can be concluded.

A short circuit can, depending upon the location at which it arises, have different consequences. It is a question of whether the voltage supply of the load is realised by the device according to the invention or by an external voltage supply. In the former case, thus if the voltage supply of the load is realised by the interface component according to the invention, there are typically only two live wires between the interface component and the load. If a short circuit arises here at any point, this can be detected through a reduction in the resistance, going hand in hand with the short circuit, in the current circuit in question.

In the switched-on state of the load the current will increase as a result of the short circuit to considerably higher values than those that arise in the normal, fault-free operation. This situation can be detected by a circuit which can detect such unusually high currents (over-currents). In the switched-off state of the load the detection of a short circuit is possible by reference to the voltage generated by the no-load current in the load circuit. The line resistances must thereby be observed, which can also ensure in case of a short circuit that a voltage arises in the load circuit. If the output terminals of the interface component according to the invention are galvanically isolated from the field side, a ground fault can possibly be detected only upon occurrence of a second fault.

If the interface component according to the invention contains only switching elements which switch on or switch off an external voltage supply, a short circuit can then arise at different points.

A short circuit at the voltage source interrupts the load supply and thus prevents a current flow through the load. This affects most diagnostic circuits like a line break, although the wiring is not disconnected at any point.

If a short circuit arises over the load this is very difficult to ascertain in the switched-off state, as the change in the load resistance caused by the short circuit is also difficult to measure with a no-load current, because the total voltage lies at the open contacts of the interface component according to the invention. If the load circuit is switched on with a load short circuit present, the fuse of the voltage supply of the load circuit trips (in many cases, in particular with suitable dimensioning of the fuse), whereby a line break results. If this is not the case, the short circuit can be detected via a current that is too high through the output terminals of the interface component according to the invention.

In the case of a short circuit at the contacts of the interface component according to the invention the load is unintentionally switched on. For the interface component itself, the voltage in the load circuit decreases to 0 volts, which many conventional diagnostic circuits indicate as a line break in the load circuit.

If an external voltage supply of the load has a ground reference, a ground fault, in particular with open collector outputs, can lead to unintentional switching-on of the load. This arises in particular if the fault arises on the wire which connects the load to the output of the interface component according to the invention.

According to a preferred embodiment of the present invention the transmitted first and/or second fault signal is/are transmitted to a switching stage in the input part of the device, wherein this switching stage assumes one of at least two possible states in dependence upon whether a fault or which fault type has been detected in the load circuit.

In this way the transmitted fault signal is represented in the input part in the form of a stable signal which can be detected by the controller.

In the present context a switching stage is to be understood to be an electronic or electrical circuit which switches, in particular switches on or off, a current, in particular in a no-load current path, in dependence upon a control signal. Examples for switching stages in this sense are relays or semiconductor circuits controlled via one or a plurality of transistors. In the present context a switched switching stage is to be understood to be a switching stage in the switched state. Correspondingly a non-switched switching stage is to be understood to be a switching stage in the non-switched state.

According to a further preferred embodiment of the present invention the galvanic isolation stage has at least one optocoupler.

Optocouplers are optoelectronic transmitters between two galvanically isolated current circuits. In comparison with other galvanic isolations they have rather small dimensions, facilitate both a digital and also an analogue transmission of a fault signal and do not have any inductances which would be considered as a source of straying electromagnetic fields. They are also insensitive with respect to interference-causing external electromagnetic fields and have shorter delay times and a lower rate of wear than electromechanical solutions. In comparison with electromagnetic solutions for galvanically isolated transmission such as relays or transformers the input and/or output circuit of such optoelectronic transmitters is, however, frequently more sensitive with respect to an overload or interference-causing impulses.

According to a further preferred embodiment of the present invention at least one fault detection circuit has a current regulator to take a test current from the load circuit, wherein the first fault signal is different according to whether the test current flows or is interrupted. This embodiment facilitates a particularly simple fault detection and a transparent transmission of fault statuses from the output part to the input part.

According to a further preferred embodiment of the present invention the test current is negligibly small with respect to a current flowing in the load circuit in the case of a load. This embodiment facilitates a fault detection with very low interference-causing effects on the load circuit.

According to a further preferred embodiment of the present invention the test current is constant.

This embodiment facilitates a fault detection which is particularly robust with respect to fluctuations in the currents in the load circuit.

According to a further preferred embodiment of the present invention the galvanic isolation stage has at least one transformer and a trigger circuit to convert the test current into an alternating test current, wherein the current regulator and the trigger circuit form a series circuit which is connected in parallel with the load switch, wherein an input of the galvanic isolation stage is connected to an output of the trigger circuit, and wherein an output of the galvanic isolation stage is connected via a first rectifier to an input of the switching stage.

This embodiment facilitates a particularly simple and at the same time effective galvanic isolation, via which an information transmission is possible with the aid of temporally changeable currents in a simple way. The alternating test current is a fault signal derived from the test current which can be transmitted via a transformer galvanically isolated from the output part to the input part.

According to a further preferred embodiment of the present invention a second rectifier is connected in series with the current regulator and the trigger circuit.

The second rectifier causes an alternating current flowing in the load circuit to be rectified in the test current circuit connected in parallel with the load circuit. In this way the fault detection circuit can work irrespectively of whether a direct current or an alternating current flows in the load circuit.

If only alternating current is expected in the load circuit and a test current taken from the load circuit would thus be, without the second rectifier, in any case an alternating current, this alternating test current could be transmitted without a trigger circuit directly via the transformer from the output part to the input part.

According to a further preferred embodiment of the present invention the galvanic isolation stage has at least one transformer to transmit an alternating test current taken directly from the load circuit.

According to a further preferred embodiment of the present invention the switching stage switches a no-load current in a no-load current path in the input part. In this way the controller "sees" at the input part of the device according to the invention a status corresponding to the status that the controller "would see" if the controller were directly connected to the load circuit. In this sense a high degree of line fault transparency is thus present here.

According to a further preferred embodiment of the present invention the no-load current has essentially the same strength as the test current. The principle of line fault transparency is realised to an even greater extent by this embodiment.

According to a further preferred embodiment of the present invention the no-load current path has in the input part a constant current source controlled by at least one transistor. The aim of the line fault transparency, in particular the provision of a defined no-load current at the input part of the device according to the invention, can be realised particularly simply and effectively with a transistor-controlled constant current source.

According to a further preferred embodiment of the present invention the electronic switching stage has at least one field effect transistor, of which the gate electrode is connected to a first output terminal of the rectifier circuit and of which the drain electrode is connected to a second output terminal of the rectifier circuit and simultaneously via the no-load current path to a switching input. The aim of the line fault transparency, in particular the provision of a defined no-load current at the input part of the device according to the invention, can be realised particularly simply and effectively with such a circuit.

According to a further preferred embodiment of the present invention the input circuit has a coil which is in active connection with at least one load switch. This preferred embodiment causes a galvanically isolated transmission of the switching commands of the controller from the input part to the output part and thus the secure control also of strong current loads by controllers on the basis of common digital circuits without the use of power semiconductors.

Furthermore a method is known according to the invention for monitoring and switching a load circuit with a load, wherein a device with an input part and an output part is or has been switched between a controller and the load circuit, the input part has an input circuit which converts switching commands of the controller, incoming via switching inputs, into switching processes of the load switches, at least one fault detection circuit detects faults in the load circuit and generates at least one first fault signal in the output part, a galvanic isolation stage transmits this first fault signal and/or a second fault signal derived from this first fault signal from the output part to the input part in a galvanically isolated way, and wherein the transmitted fault signal is made available via the switching inputs for evaluation.

According to a preferred embodiment of the method according to the invention a device according to the invention has been or is switched between the controller and the load circuit, in particular according to one of the preferred embodiments described.

BRIEF DESCRIPTION OF THE DRAWINGS

Further advantageous exemplary embodiments of the invention are explained below with reference to the attached schematic drawings, in which.

DETAILED DESCRIPTION OF THE INVENTION

Figure 1:
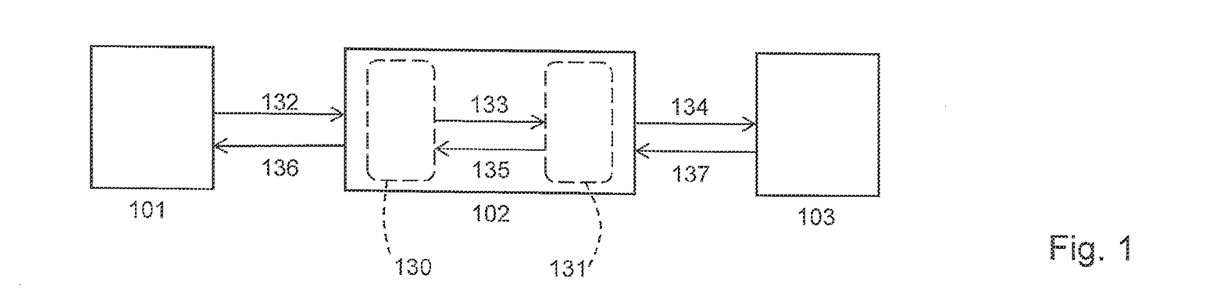
FIG. 1 shows a schematic illustration of an arrangement according to the invention of a device according to the invention for monitoring and switching a load circuit between a controller and a load circuit

A typical, general structure, forming the basis of the present invention, of an arrangement with a controller 101, an interface component 102 and a load circuit 103 is shown in FIG. 1.

The load circuit is the current circuit of a unit 103, such as for example an actuator or a sensor, connected to the interface component 102 on the field side of the interface component 102 according to the invention. In the interface component 102 there is an input part 130 and an output part 131. The controller 101 transmits control signals 132 to the interface component according to the invention which are received by the input part 130 and converted into control signals 133 of the input part to the output part 131. The output part 131 controls (arrow 134) in turn the load circuit 103. Faults in the load circuit (arrow 137) affect the fault detection in the interface component and are transmitted by circuits for fault detection of the output part to the input part (arrow 135). The interface component according to the invention brings about in this way a fault simulation 136 of a fault in the load circuit for the controller 101.

The present invention facilitates a line fault transparency in the sense that a fault, for example a line break or a short circuit, in the wiring on the field side of an interface component according to the invention is transmitted to the control side thereof so that the controller can detect the fault, wherein the fault manifests itself on the control side in a similar or the same way for the controller as if this fault arising on the field side were present on the control side of the interface component according to the invention.

Figure 2:
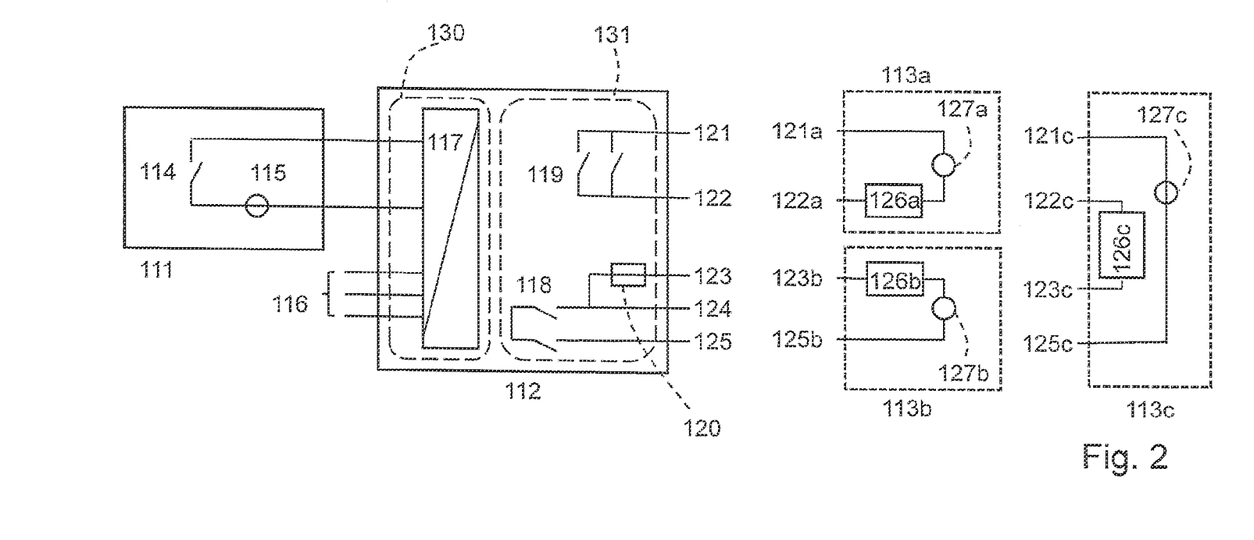
FIG. 2 shows schematic illustrations of an arrangement of an interface component according to the state of the art between a controller and load circuits

FIG. 2 shows an arrangement according to the state of the art having an interface component 112 according to the state of the art, of which the input part 130 has one or a plurality of relays 117 which are controlled together, with which the switches 118 and 119 can be switched in the output part 131. The current through the relay 117 comes from a current source 115 of the controller 111 which is switched using a switch 114 of the controller. The input part 130 of the interface component 112 can furthermore have test inputs 116.

In the arrangement from the state of the art shown in FIG. 2 the switches 118 are connected in series, whereby a reliable switching-off of the load circuit 113b becomes possible. The load circuit 113b consists of the load 126b and the load circuit supply 127b and is connected via the contacts 123b and 125b to the output terminals 123 and 125 of the output circuit 131, whereby in the example shown here a fuse 120 is also provided. The switches 119 are connected in parallel, whereby a secure switching-on of the load circuit 113a, which consists of a load 126a and a load supply 127a and is connected via the connections 121a and 122a to the connection terminals 121 and 122 of the output circuit 131, is facilitated. The load circuit 113c consisting of the load 126c and the load circuit supply 127c is connected via the connections 121c, 122c, 123c and 125c to the connection terminals 121, 122, 123 and 125 of the interface component 112.

Figure 3:
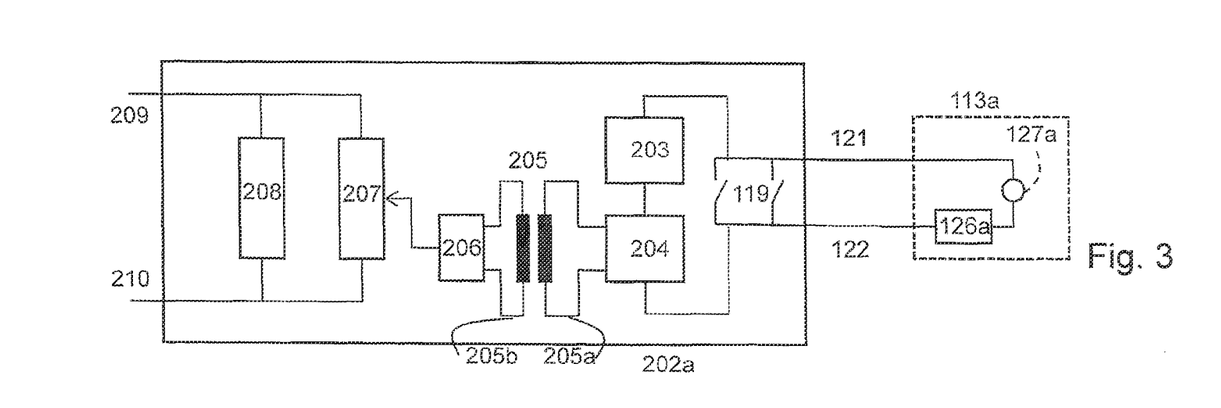
FIG. 3 shows a schematic illustration of an exemplary embodiment of a device according to the invention for monitoring and switching a load circuit.

FIG. 3 shows a preferred exemplary embodiment of an interface component 202a according to the invention which is connected via the input terminals 209 and 210 of the interface component to the controller and which is connected via the output terminals 121 and 122 of the interface component to the load circuit 113a. The switches 119 connected in parallel are preferably switched by a relay of the input circuit 208. A series circuit of the current regulator 203 with the trigger circuit 204 is arranged parallel to the load circuit. The trigger circuit 204 converts the constant current of the current regulator 203 into a temporally changing signal which can be transmitted via the transmitter 205 to the rectifier 206. The output signal of the rectifier 206 switches the switchable no-load current branch 207.

When the output contacts 119 are open, a preferably small current is taken from the load circuit 113a. This is only possible if the load circuit supply 127a is present and in operation and if the wiring of the load circuit is in order. The flow of this current is thus an indication of the proper operational readiness of the load circuit. In this case the trigger circuit 204 is triggered to generate an alternating current signal which is transmitted via the transmitter 205 to a rectifier 206. This rectifier 206 controls the input-side no-load current circuit 207 so that a no-load current only flows here if a no-load current flows in the load circuit 113a. The galvanic isolation 205 isolates the input side 130 from the output side 131 galvanically and hereby facilitates the monitoring also of high voltages in the load circuit that would be too great for a direct monitoring by the controller 101.

Figure 4:
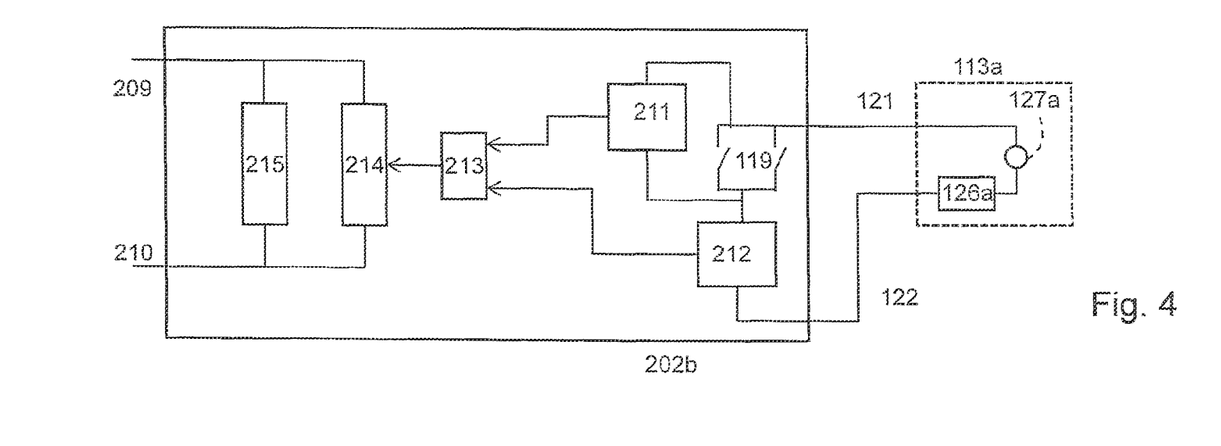
FIG. 4 shows a schematic illustration of a device according to the invention for monitoring and switching a load circuit, wherein an auxiliary power source is present for the load circuit.

FIG. 4 shows a further device, wherein the interface component 202b according to the invention has two fault detection circuits 211 and 212, wherein the fault detection circuit 211 is connected in parallel with the load circuit 113a and wherein the fault detection circuit 212 is integrated in series into the load circuit 113a. A current thus only flows through the fault detection circuit 212 if at least one of the switches 119 is closed, whereas a voltage is only supplied at the fault detection circuit 211 if both switches 119 are opened. The logic circuit 213 links the results of the fault detections 211 and 212 and the logic result switches the no-load current switching stage 214 which is arranged in parallel with the input circuit 215 which activates the switches 119.

Instead of a trigger circuit and a transmitter with downstream rectifier the fault signal is transmitted here without galvanic isolation via a logic circuit, preferably an OR-gate, from the output side to the input side. The control of the switchable no-load current branch 207 can preferably be realised galvanically isolated via a relay 309.

Figure 5:
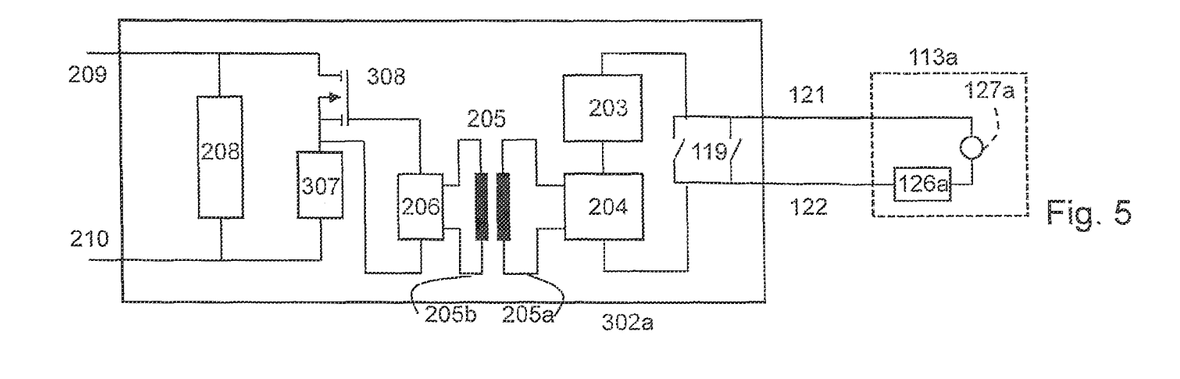
FIG. 5 shows a schematic illustration of a further embodiment of a device according to the invention for monitoring and switching a load circuit.

FIG. 5 shows a concrete illustration of the embodiment shown in FIG. 3, wherein the no-load current branch 207 or 307 is switched by a MOSFET 308, of which the gate is controlled by the output of the rectifier 206. The voltage supplied at the output side of the rectifier 206 preferably switches in a conducting mode the MOSFET 308 which keeps the no-load current circuit 307 live, which signals the status "load circuit OK" to the controller 101.

Figure 6:
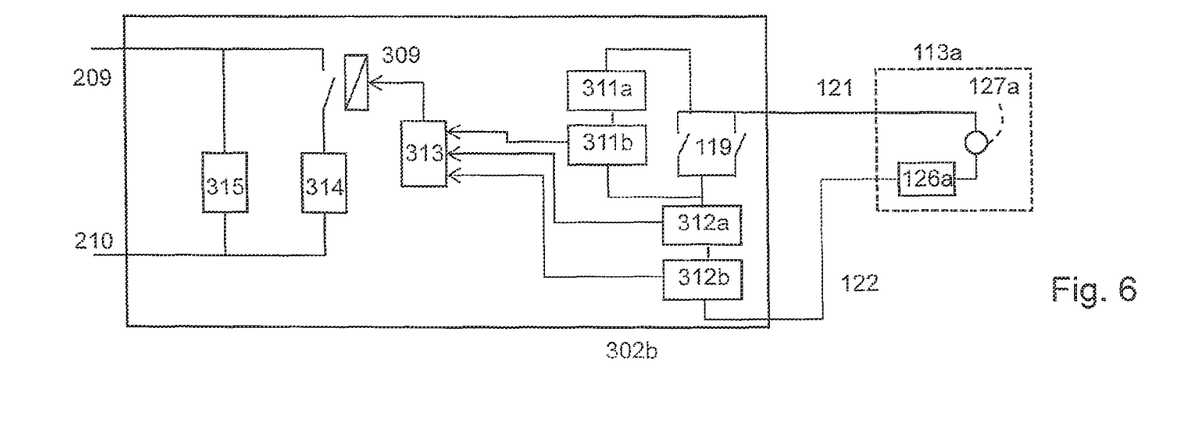
FIG. 6 shows a schematic illustration of a device according to the invention for monitoring and switching a load circuit, wherein an auxiliary power source is present for the load circuit.

FIG. 6 shows a concrete illustration of the exemplary embodiment shown in FIG. 4, wherein the fault detection circuit 211 has a test current branch 311a and a circuit for line break detection 311b, and wherein the fault detection circuit 212 has a circuit for line break detection 312a and a circuit for short circuit detection 312b. The output signals of the fault detection circuits 311d, 312a and 312b are logically linked in the logic circuit 313, for example an OR-gate, and the result of this link controls a relay 309 which switches the no-load current branch 314. The relay opens a series contact in the input circuit, which can be detected by the controller. The input circuit 315 activates the switches 119.

Figure 7:
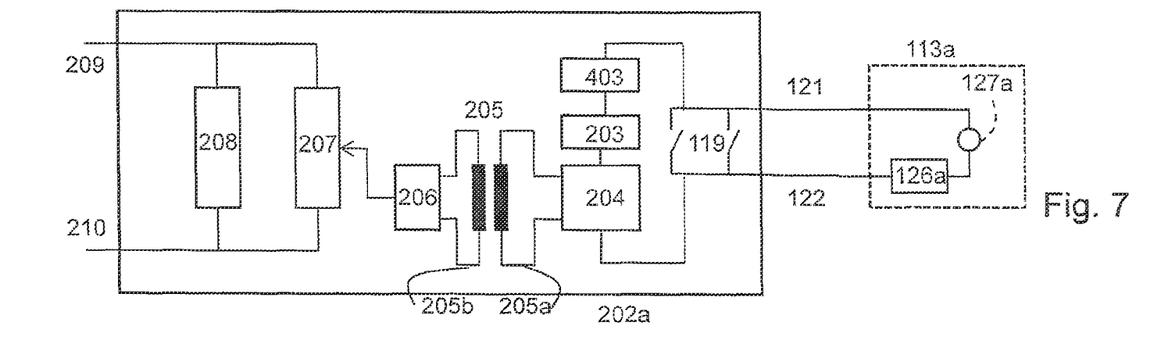
FIG. 7 shows a schematic illustration of a further exemplary embodiment of a device according to the invention for monitoring and switching a load circuit.

FIG. 7 shows a variant of the exemplary embodiment shown in FIG. 3, wherein a rectifier 403 has been integrated into the series connection of the circuits 203 and 204. With this exemplary embodiment of the invention, due to the rectifier 403, the detection of alternating currents in the load circuit 113a is also possible.

Figure 8:
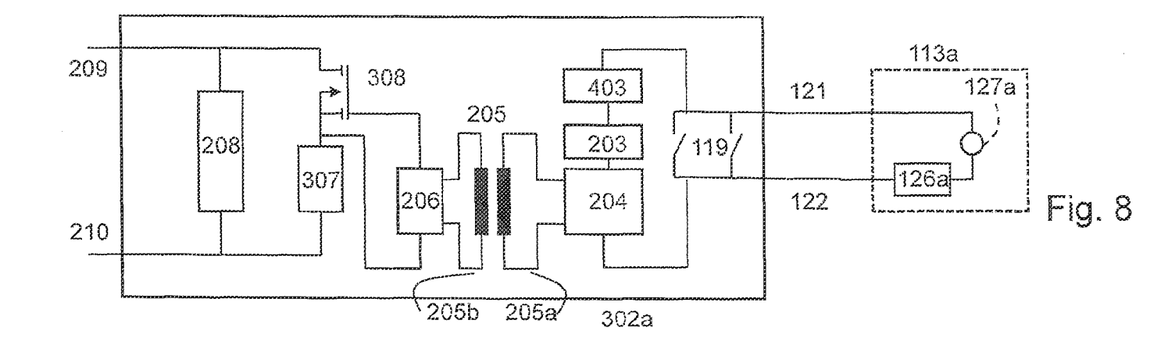
FIG. 8 shows a schematic illustration of a further exemplary embodiment of a device according to the invention for monitoring and switching a load circuit.

FIG. 8 shows a variant of FIG. 4, wherein correspondingly a rectifier 403 has been integrated into the series connection of the circuits 203 and 204. With this exemplary embodiment of the invention, due to the rectifier 403, the detection of alternating currents in the load circuit 113a is also possible.

Figure 9:
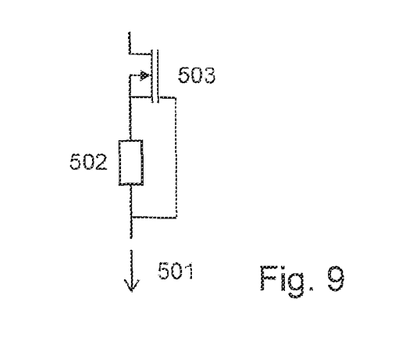
FIG. 9 shows a schematic illustration of an exemplary embodiment of a constant current source in a device according to the invention for monitoring and switching a load circuit.

FIG. 9 shows a current source circuit, through which a current 501 flows, wherein the current source circuit consists of a shunt resistor 502 and a depletion MOSFET 503. The voltage drop at the shunt resistor 502, which is proportional to the current 501, produces a decrease in the gate voltage of the MOSFET 503, whereby the current 501 is limited by the shunt resistor 502.

In applications with a large voltage range a no-load current generation through a resistor alone—as is common with some control outputs—is not seriously considered, because with a constant resistance value the current at the end of the input voltage range would increase to a multiple of, e.g. ten times, the initial current. A no-load current generation via a constant current circuit, as shown for example in FIG. 9, is therefore preferable particularly in these cases. As the no-load current branch in this case simultaneously constitutes the power supply of the circuit, the circuit design for the no-load current generation should not require any separate power supply.

An advantage of the current source shown in FIG. 9 can also be seen in that this solution can also be considered with large voltage ranges of for example 253V alternating current with peak values of up to 358V, whereas other approaches such as for example constant current diodes or integrated voltage regulators should not be used with a shunt resistor. In the context of the invention therefore a constant current source with a depletion MOSFET with a shunt resistor is preferred, as shown for example in FIG. 9.

Figure 10:
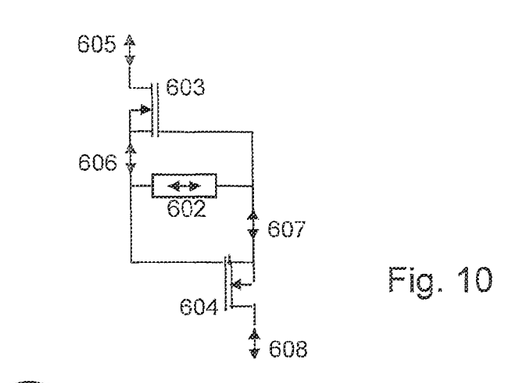
FIG. 10 shows a schematic illustration of an exemplary embodiment of a constant current source in a device according to the invention for monitoring and switching a load circuit.

FIG. 10 shows a variant of a current source which is not polarity-dependent and can therefore be operated independently of a certain polarity of the supply voltage. For this, the circuit shown in FIG. 9 is extended by a second MOSFET. The current regulation is always realised by the one of the two MOSFETs 603 or 604, at the drain terminal of which the positive potential lies. As in the circuit shown in FIG. 9, the current 605, 608 which flows through the resistor 602 generates a negative gate-source voltage which narrows the channel of the MOSFET and thus limits the current to a value chosen by the resistor. As the second MOSFET is connected with reverse polarity to this resistor 602 the voltage drop across the resistor is a positive gate-source voltage here, whereby the channel is enlarged and the unhindered flow-through of the current is made possible.

If the voltage at the circuit shown in FIG. 10 is not greater than 26.5V, a favourable and space-saving MOSFET can be used with an N-channel MOSFET of the depletion type such as for example with the transistor BSS139. This can have a maximum drain source voltage of 250V and facilitate a current of 30 mA with a gate-source voltage of 0V. The gate threshold voltage lies with a typical value of −1.4V and deviations of −1V to −2.1V in the same range as for example in the case of the transistor BSP135. With a resistance value of 390 Ohm, in the circuit shown in FIG. 10, a current of approximately 2 mA is generated as no-load current on the control side, with which all output cards on which the interface component according to the invention is to be used should manage.

Figure 11:
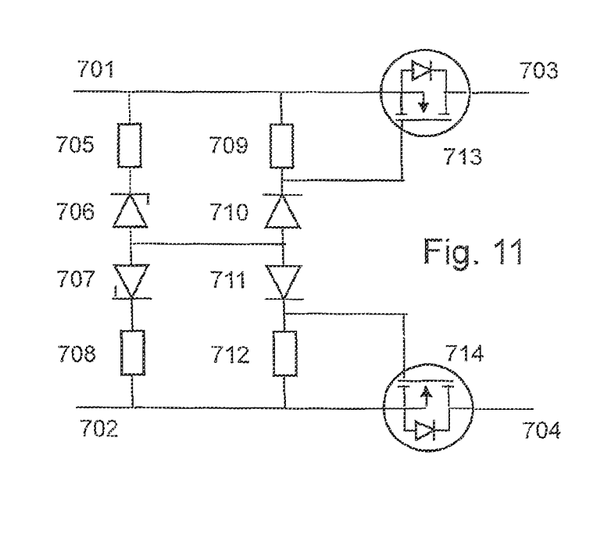
FIG. 11 shows a schematic illustration of an exemplary embodiment of an overvoltage protection circuit in a device according to the invention for monitoring and switching a load circuit.

FIG. 11 shows a sub-circuit of an embodiment of an interface component according to the invention, with which the switching state of the control output can be detected. The voltage at the control output for a 0 signal should preferably lie below 3V DC and for a 1 signal above 20V DC. This circuit must thus ensure that the input of the interface component according to the invention is securely isolated at voltages below 3V and securely switched on at voltages above 20V. The polarity of the input voltage may not play any part here, as is also the case with the input of the interface component.

In order to facilitate the polarity-dependent use the circuit consists of two mirror-symmetrically identical parts which are each accommodated in one of the two wires that connect the control output to the input of the relay. The MOSFET 703, 704 in the branch with the negative potential switches on and off the input of the interface component according to the invention. The other MOSFET 703, 704 in the branch with the positive potential is bridged by the integrated diode. The switching threshold, at which switching-on or switching-off takes place, is given by a voltage divider comprising two resistors 705, 708 and two Z diodes (Zener diodes) 706 and 707. The Z diode which lies closer to the wire with the positive potential is operated in Z direction and the second diode in the forward direction. As soon as the input voltage exceeds the total of Z voltage plus forward voltage, the remaining voltage is divided in the same proportion at the two resistors.

The gate terminals of the two MOSFETs are connected to the middle of the voltage divider, whereby the diode connected first in each case ensures that the MOSFET in the negative branch cannot be activated by the resistor of the other MOSFET located between the gate and source. The gate-source voltage of the MOSFET located in the negative branch corresponds to the voltage which drops across one of the two resistors, whereby the MOSFET is fully connected through with a sufficiently high input voltage.

When using 8.2V Z diodes this voltage is approximately 14V and thus lies precisely in the predefined range between 3 and 20V. Thereby, the gate-source voltage at the MOSFET is approximately 2.5V. With an input voltage of 20V there is a computational gate-source voltage of 5.5V, with which the MOSFET can be sufficiently connected through in each case. The gate-source voltage of the MOSFET in the positive branch is negative, whereby it cannot be controlled through. However, as the current can flow via the diode integrated into the MOSFET, the through-connection of this MOSFET is not necessary. With computational −16.3V the voltage remains here, at the maximum input voltage of the interface component according to the invention, sufficiently far below the maximum gate-source voltage of +/−20V usual for MOSFETs.

Figure 12:
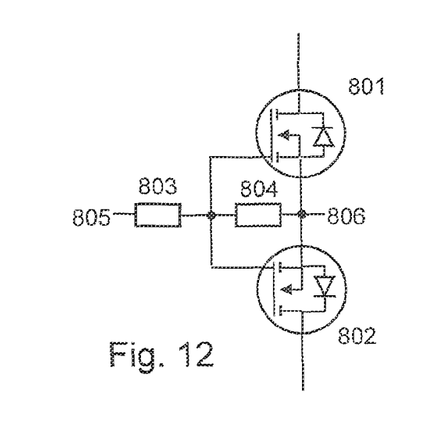
FIG. 12 shows a schematic illustration of an exemplary embodiment of a circuit arrangement for separating the no-load current path in a device according to the invention for monitoring and switching a load circuit.

FIG. 12 shows a sub-circuit for separating the no-load current path with two anti-series connected MOSFETs 801 and 802 and also the resistors 803 and 804 at the connection points 805 and 806. The sub-circuit shown in FIG. 12 is used in FIG. 13 and is designated there by the reference numeral 808.

Figure 13:
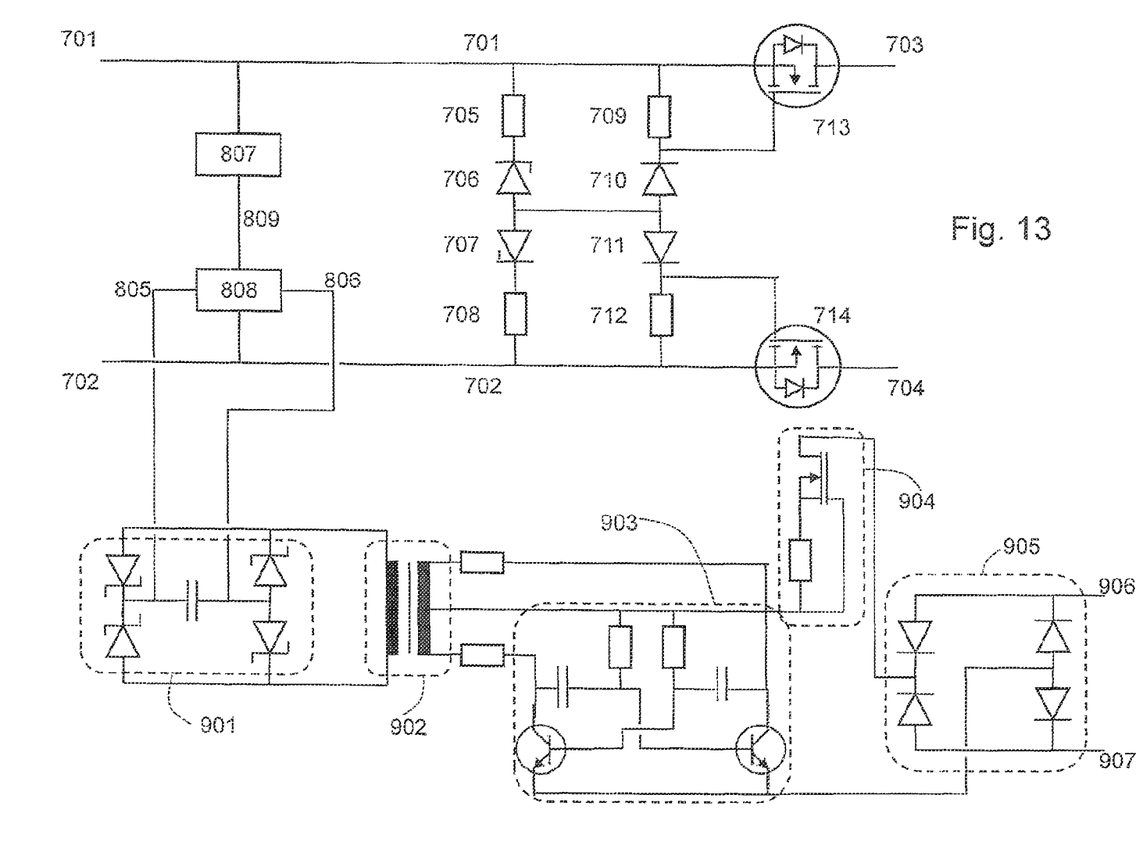
FIG. 13 shows a schematic illustration of an exemplary embodiment of a sub-circuit in a device according to the invention for monitoring and switching a load circuit.

FIG. 13 shows the wiring diagram of the interface component according to the invention in an exemplary embodiment. The connection terminals 805 and 806 of the circuit arrangement 808 for separating the no-load current branch are connected to the outputs of the rectifier 901 which rectifies the alternating current signal which is transmitted by the transmitter 902. The rectifier 905 corresponds to the rectifier 403 in FIGS. 7 and 8. The current regulator 904 causes the trigger circuit 903 to oscillate so that the output signal thereof is transmitted via the transmitter 902 and rectified by the rectifier 901. In the input-side no-load current branch 807 of the interface component, a no-load current thus flows precisely when a current also flows in the output-side no-load current branch 904. Interruptions in the current in the load circuit are thus forwarded to the input side of the interface component as interruptions in the current on the input side.

Figure 14:
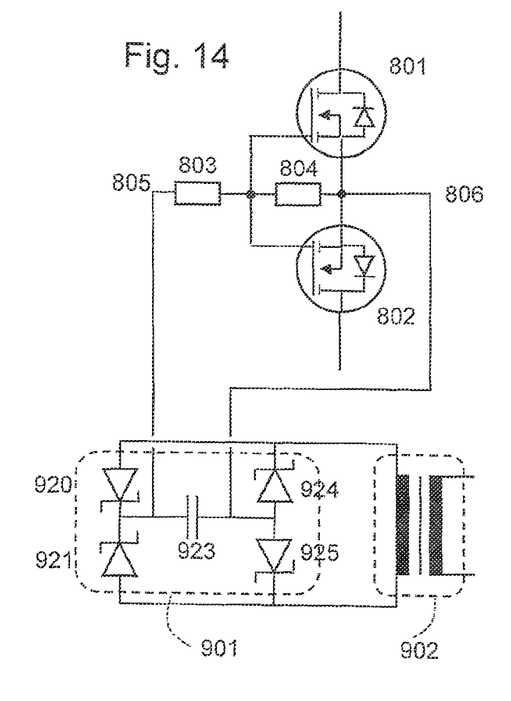
FIG. 14 shows a schematic illustration of an exemplary embodiment of a sub-circuit in a device according to the invention for monitoring and switching a load circuit.

FIG. 14 shows a sub-circuit of the whole circuit shown in FIG. 13. The rectifier 901 consists in this exemplary embodiment of the Schottky diodes 920, 921, 924 and 925 as well as the capacitor 923.

Figure 15:
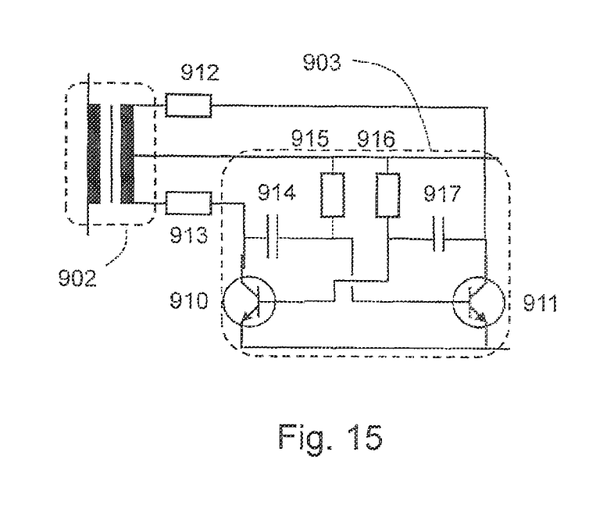
FIG. 15 shows a schematic illustration of an exemplary embodiment of a sub-circuit in a device according to the invention for monitoring and switching a load circuit.

FIG. 15 shows as an exemplary embodiment a sub-circuit of FIG. 13, in which the trigger circuit consists of the bipolar transistors 910 and 911 and of the resistors 912, 913, 915 and 916 and also of the capacitors 914 and 917.

In the variants shown in FIGS. 3, 5, 7 to 15, no auxiliary power source is necessary to supply the device according to the invention.

LIST OF REFERENCE NUMERALS

101 Controller
102 Interface component according to the invention, device for monitoring and switching a load circuit
103 Load circuit, field-side unit, actuator, sensor
111 Controller
112 Interface component according to the state of the art
113a Load circuit
113b Load circuit
113c Load circuit
114 Switch
115 Current source
116 Test inputs
117 Relay
118 Parallel switches
119 Series switches
120 Fuse
121 Output terminal of the interface component
122 Output terminal of the interface component
123 Output terminal of the interface component
124 Output terminal of the interface component
125 Output terminal of the interface component
121a Input terminal of a load circuit
121c Input terminal of a load circuit
122a Input terminal of a load circuit
122c Input terminal of a load circuit
123b Input terminal of a load circuit
123c Input terminal of a load circuit
125b Input terminal of a load circuit
125c Input terminal of a load circuit
126a Load
126b Load
126c Load
127a Current supply in a load circuit
127b Current supply in a load circuit
127c Current supply in a load circuit
130 Input part
131 Output part
132 Control signals to interface component
133 Control of the output part by the input part
134 Control of the load circuit by the output part
135 Fault message of the output part to the input part
136 Fault simulation of the interface component for the controller
137 Effect of a load circuit fault on the fault detection
202a Interface component according to the invention
202b Interface component according to the invention
203 Current regulator
204 Trigger circuit
205 Transmitter, transformer, galvanic isolation stage
205a Primary side input of the galvanic isolation stage
205b Secondary side output of the galvanic isolation stage
206 Rectifier
207 Switchable no-load current branch
208 Input circuit
209 Input terminal of the interface component
210 Input terminal of the interface component
211 Fault detection circuit
212 Fault detection circuit
213 Logic circuit
214 No-load current switching stage
215 Input circuit
302a Interface component according to the invention
302b Interface component according to the invention
307 No-load current branch
308 MOSFET
309 Relay
311a Test current branch
311b Line break detection
312a Line break detection
312b Short circuit detection
313 Logic circuit, OR-gate
314 Relay in no-load current switching stage
315 Input circuit
403 Rectifier
501 Current through current source circuit
502 Shunt resistor
503 Depletion MOSFET
602 Resistor
603 Depletion MOSFET
604 Depletion MOSFET
605 Current through current source circuit
606 Current through the resistor 602
607 Current through the resistor 602
608 Current through current source circuit
701 (Positive) supply voltage
702 (Negative) supply voltage
703 Input terminal of the interface component
704 Input terminal of the interface component
705 Resistor
706 Zener diode
707 Zener diode
708 Resistor
709 Resistor
710 Diode
711 Diode
712 Resistor
713 MOSFET
714 MOSFET
801 MOSFET
802 MOSFET
803 Resistor
804 Resistor
805 Switching input of the no-load current branch 806 Switching input of the no-load current branch
807 Current source
808 Switching stage in the no-load current branch
901 Rectifier
902 Transmitter, transformer
903 Trigger circuit
904 Current source
905 Rectifier
906 Connection terminal of the rectifier in the fault detection
907 Connection terminal of the rectifier in the fault detection
910 Bipolar transistor in the trigger circuit
911 Bipolar transistor in the trigger circuit
912 Resistor
913 Resistor
914 Capacitor
915 Resistor
916 Resistor
917 Capacitor
920 Schottky diode
921 Schottky diode
923 Capacitor
924 Schottky diode
925 Schottky diode

What is claimed is:

1. A device for monitoring and switching a load circuit, having:
    a) an input part and an output part,
    b) switching inputs to connect a controller to the input part,
    c) switching outputs to connect at least one load circuit with at least one load to be switched to the output part,
    d) at least one load switch for switching, in particular for switching on and off, the at least one load, wherein
    e) the input part has an input circuit which converts switching commands of the controller incoming via the switching inputs into switching processes of the load switches,
    f) having at least one fault detection circuit to detect a fault in the load circuit and to generate at least a first fault signal in the output part and
    g) a galvanic isolation stage for galvanically isolated transmission of at least one of: this first fault signal or a second fault signal derived from this first fault signal from the output part to the input part,
    h) wherein the transmitted fault signal is made available via the switching inputs for evaluation.

2. The device according to claim 1,
characterised in that
at least one of: the transmitted first or second fault signal is transmitted to a switching stage in the input part of the device, wherein this switching stage assumes one of at least two possible states in dependence upon whether a fault or which fault type has been detected in the load circuit.

3. The device according to claim 2,
characterised in that
the switching stage switches a no-load current in a no-load current path in the input part.

4. The device according to claim 3,
characterised in that
the no-load current path in the input part has a constant current source controlled by at least one transistor.

5. The device according to claim 2,
characterised in that
the electronic switching stage has at least one field effect transistor, of which the gate electrode is connected to a first output terminal of the rectifier circuit and of which the drain electrode is connected to a second output terminal of the rectifier circuit and simultaneously via the no-load current path to a switching input.

6. The device according to claim 1,
characterised in that
the galvanic isolation stage has at least one optocoupler.

7. The device according to claim 1,
characterised in that
at least one fault detection circuit has a current regulator to take a test current from the load circuit, wherein the first fault signal is different depending upon whether the test current flows or is interrupted.

8. The device according to claim 7,
characterised in that
the test current is negligibly small in relation to a current flowing in the load circuit in the case of load.

9. The device according to claim 7,
characterised in that
the test current is constant.

10. The device according to claim 7,
characterised in that
    a) the galvanic isolation stage has at least one transformer and
    b) a trigger circuit to convert the test current into an alternating test current, wherein
    c) the current regulator and the trigger circuit form a series circuit which is connected in parallel with the load switch,
    d) an input of the galvanic isolation stage is connected to an output of the trigger circuit and wherein
    e) an output of the galvanic isolation stage is connected via a first rectifier to an input of the switching stage.

11. The device according to claim 7,
characterised in that
a second rectifier is connected in series with the current regulator and the trigger circuit.

12. The device according to claim 7,
characterised in that
the no-load current has essentially the same strength as the test current.

13. The device according to claim 1,
characterised in that
the input circuit has a coil which is in active connection with at least one load switch.

14. A method for monitoring and switching a load circuit with a load, wherein
    a) a device with an input part and an output part is or has been switched between a controller and the load circuit,
    b) the input part has an input circuit which converts switching commands of the controller incoming via switching inputs into switching processes of the load switches,
    c) at least one fault detection circuit detects faults in the load circuit and generates at least a first fault signal in the output part,
    d) a galvanic isolation stage transmits at least one of: this first fault signal or a second fault signal derived from this first fault signal from the output part to the input part in a galvanically isolated way, and wherein
    e) the transmitted fault signal is made available via the switching inputs for evaluation.

15. The method according to claim 14, wherein the device includes:
    a) the input part and the output part,
    b) the switching inputs to connect the controller to the input part, c) switching outputs to connect at least one load circuit with at least one load to be switched to the output part,
d) at least one load switch for switching, in particular for switching on and off, the at least one load,
e) the at least one fault detection circuit to detect a fault in the load circuit and to generate at least a first fault signal in the output part and
f) the galvanic isolation stage for galvanically isolated transmission of the at least one of: this first fault signal or the second fault signal derived from this first fault signal from the output part to the input part.

* * * * *